BEST AVAILABLE COPY

United States Statutory Invention Registration [19]

[11] Reg. Number: H411

Yoder- [43] Published: Jan. 5, 1988

[54] QUASI-ACCUMULATION MODE FET

[75] Inventor: Max N. Yoder, Falls Church, Va.

[73] Assignee: United States of America, Washington, D.C.

[21] Appl. No.: 770,166

[22] Filed: Aug. 28, 1985

[51] Int. Cl.[4] ..... H01L 29/80; H01L 29/161; H01L 29/167

[52] U.S. Cl. ..... 357/22; 357/16; 357/64

[58] Field of Search ..... 357/22 A, 22 MD, 16, 357/64

[56] References Cited

U.S. PATENT DOCUMENTS

| | | | |
|---|---|---|---|
| 4,297,783 | 11/1981 | Casey, Jr. et al. | 357/64 |
| 4,424,525 | 1/1984 | Mimura | 357/22 |
| 4,559,547 | 12/1985 | Shiraki et al. | 357/16 |
| 4,593,301 | 6/1986 | Inata et al. | 357/22 |
| 4,605,945 | 8/1986 | Katayama et al. | 357/22 |
| 4,641,161 | 2/1987 | Kim et al. | 357/22 |

FOREIGN PATENT DOCUMENTS

| | | | |
|---|---|---|---|
| 0143673 | 7/1985 | Japan | 357/16 |

*Primary Examiner*—Stephen C. Buczinski
*Assistant Examiner*—Linda J. Wallace
*Attorney, Agent, or Firm*—Ansel M. Schwartz; Andrew M. Lesniak; John L. Forrest

[57] ABSTRACT

A Field Effect Transistor (FET) capable of withstanding increased positive gate biasing with respect to the source contact without incurring the penalty of drawing excessive gate current, comprising a semi-insulating substrate layer; an active channel layer of doped n-type semi-conductor material disposed on the substrate layer; a first heteroepitaxial semi-insulating layer of a semi-insulating material having a bandgap greater than the bandgap of the active channel layer material disposed on said active channel layer. The first heteroepitaxial layer has a top surface, a designated first region, a designated second region, and a designated middle section disposed therebetween wherein the first region and the second region of the first heteroepitaxial layer are implanted with activated donor impurities to form its source and drain regions. The device is also provided with conventional source, drain and gate contacts. In a preferred embodiment, a heavily donor doped Gallium arsenide heteroepitaxial layer is disposed between the source contact and the first heteroepitaxial layer and between the drain contact and the first heteroepitaxial layer. In one embodiment, the first heteroepitaxial layer is impurity doped with chromium or vanadium.

9 Claims, 8 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

QUASI-ACCUMULATION MODE FET

BACKGROUND OF THE INVENTION

The present invention relates to semiconductor device technology and more particularly to Quasi-Accumulation Mode Power Field Effect Transistors (QAMFETs).

The gallium arsenide (GaAs) metal Schottky barrier field effect transistor (MESFET) has been known since 1964 and is now in widespread use. In normal MESFET operation the gate contact is biased negative with respect to the source contact and electron current flows from a source region to a drain region via an active channel disposed under a gate. At maximum negative potential the electrons under the gate are driven (repelled) away from the gate and pinch-off of the flow of electrons (current) from the source to the drain edge of the device occurs. As the negative gate potential is decreased, electrons flow from the source through the active channel to the drain edge producing current flow. This is called depletion mode operation. When the gate is biased positive with respect to the source in a normal MESFET many of the electrons from the source edge of the GaAs channel are collected by the gate and current flow from source to drain is reduced. For a given gate voltage the channel current flow increases as the drain voltage increases. Eventually, for sufficiently large drain voltages, the current will saturate. Voltage breakdown on the drain edge of the control gate occurs at a larger voltage. Thus a significant limitation of the GaAs MESFET is its inability to handle large voltages without experiencing voltage breakdown on the drain edge of the control gate. Another limitation is the self-depletion of charge carriers just beneath the upper surface of the active channel as a result of mid-gap Fermi level pinning associated with large surface state densities of fixed charge.

To overcome the self-depletion of charge problem, manufacturers of GaAs power MESFETs have generally resorted to the fabrication of active channel layers much thicker than required for optimum device performance. These channels are then etched back in their centers until the saturated source-drain current value is acceptable. A Schottky control gate is then deposited in the etched-back mid channel region. The procedure is known as recessed gate technology and has become the industry standard. FIG. 1 is a schematic crosssection diagram of a prior art MESFET 10 device manufactured according to this process. The MESFET is provided with an n-Type recessed GaAs Epitaxial channel 12, a source contact 14, a metal gate 16 and a drain contact 18 grown in order on a semi-insulating GaAs substrate 20.

Fabrication by the recessed gate technology is cumbersome and does not lend itself to high yield, integrated circuit fabrication as the etch-back must be carefully done under electrical bias in a wet chemical solution. The result is a very non-planar surface.

SUMMARY OF THE INVENTION

Accordingly, it is an object of the present invention to provide a field effect transistor capable of withstanding increased positive gate biasing with respect to the source contact without incurring the penalty of drawing excessive gate current.

It is yet another object of the present invention to provide a field effect transistor which is not degraded by self-depletion problems.

Yet another object of the present invention is to provide a field effect transistor which eliminates the need for carefully controlled etchback under electrical bias during fabrication.

Yet another object of the present invention is to provide a field effect transistor with increased voltage handling capabilites compared to prior art transistors.

These and other objects of the present invention are achieved by a transistor which includes a semi-insulating substrate layer; an active channel layer of doped n-type semiconductor material disposed on the active channel layer; and a first heteroepitaxial semi-insulating layer of semiconductor material disposed on the active channel layer. The first heteroepitaxial layer material has a bandgap greater than the bandgap of the active channel layer material. The first heteroepitaxial layer has a top surface, a designated first region, a designated second region, and a designated middle section therebetween. The first region and the second region are implanted with donor impurities and activated. The transistor further includes a source contact disposed on the top surface of the first region of the first heteroepitaxial layer. A drain contact is also disposed on the top surface of the second region of the first heteroepitaxial layer. A gate control contact is also disposed on the first heteroepitaxial layer positioned on the middle region between the source contact and the drain contact and being physically separated from the source contact and the drain contact.

In a preferred embodiment, a heavily donor-doped gallium arsenide heteroepitaxial layer is disposed between the source contact and the first heteroepitaxial layer and between the drain contact and the first heteroepitaxial layer. In one embodiment, the first heteroepitaxial layer is impurity doped with chromium or vanadium to improve its insulating quality.

DESCRIPTION OF THE PREFERRED EMBODIMENT

Figure 1:
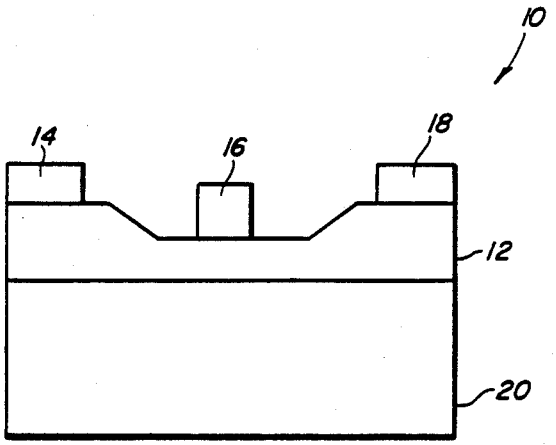
PRIOR ART FIG. 1
FIG. 1 is a schematic cross-sectioned diagram of a prior art MESFET device.

Referring now to the drawings, wherein like reference characters designate like or corresponding parts throughout the several views, FIG. 1 is a schematic cross-sectioned diagram of a prior art MESFET device. The MESFET 10 is provided with an n-type recessed GaAs epitaxial channel 12, a source contact 14, a gate contact 16-and a drain contact 18 grown in order on a semi-insulating GaAs substrate 20.

Figure 2:
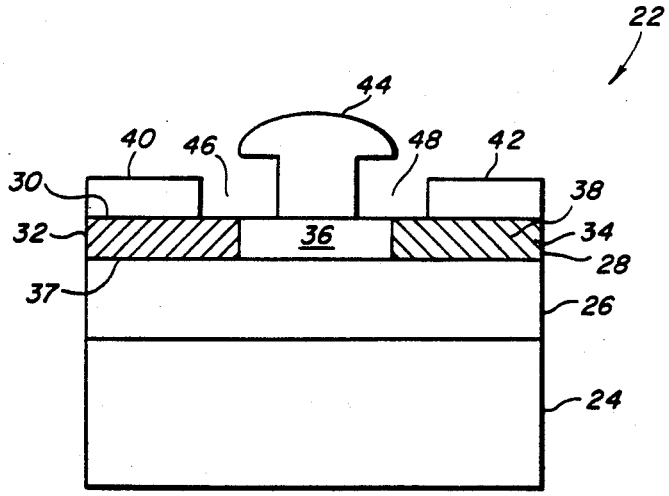
FIG. 2 is a schematic cross-sectioned diagram of one embodiment of the transistor of the present invention.

FIG. 2 shows the transistor 22 of the present invention. Transistor 22 comprises a semi-insulating substrate layer 24; an active channel layer 26 of doped n type semiconductor material disposed on the active channel layer 26; and a first heteroepitaxial semi-insulating layer 28 of semiconductor material disposed on the active channel layer 26. The first heteroepitaxial layer material 28 has a band gap greater than the band gap of the active channel layer material 26. The first heteroepitaxial layer 28 has a top surface 30, a designated first region 32, a designated second region 34, and a middle region 36 therebetween. The first side 32 and the second side 34 are implanted with donor impurities and activated by optical flash to form n+regions 37,38. Control Gate 44 forms the mask for the ion implantation. The transistor 22 further includes a source contact 40 disposed on the top surface 30 of the first heteroepitaxial layer 28 on the first region of the first heteroepitaxial layer 28. A drain contact 42 is also disposed on the top surface 30 on the second region 34 of the first heteroepitaxial layer 28. A gate control contact 44 is disposed on the middle region 36 of the heteroepitaxial layer 28 between the source contact 40 and the drain contact 42 and is physically separated from the source contact 40 and the drain contact 42 by spacings 46,48.

The embodiment of the transistor as shown in FIG. 2 uses a semi-insulating substrate layer 24 of gallium arsenide as a base, however any substrate material capable of insulating the FET active structure from the remaining components of the transistor may be used. Those substrate materials include semi-insulating gallium aluminum arsenide.

The active channel layer 26 is provided as a path along which the majority carriers flow from the source 40 to the drain contact 42 and may be fabricated of any material suitable for this purpose. In the embodiment of FIG. 2 n-type gallium arsenide, donor doped to a level of $2\times10^{17}$ $cm^{-3}$ was used. The thickness and impurity doping are conventional and are chosen in the usual manner to provide for desired device characteristics. The active channel 26 layer is shown by way of example as being 120 nanometers in thickness.

While the material of the first heteroepitaxial layer 28 may take a variety of forms, when the active channel layer 26 is a semi-conductor material such as gallium arsenide the heteroepitaxial layer 28 may conveniently take the form of semi-insulating gallium aluminum arsenide. The heteroepitaxial layer 28 may be deposited over the active channel layer 26 by a variety of techniques. These techniques include molecular beam epitaxy (MBE) and metal oxide chemical vapor deposition (MOCVD).

The heteroepitaxial layer 28 disposed over the active channel layer 26 performs several important features providing for the invention of the present application. The layer 28 provides a ready source of electrons for the active channel and acts as a barrier to retard the flow of electrons into the gate contact. Initially the layer 28 should comprise an undoped semi-insulating material having a bandgap greater than the bandgap of the active channel layer 26 material. In the embodiment of FIG. 2 gallium aluminum arsenide was used. Although virtually any mole fraction ratio of gallium aluminum arsenide may be used, best performance is achieved by 23% aluminum or 90–100% aluminum. The first region 32 and the second region 34 of the heteroepitaxial layer 28 beneath the sourc 40 and drain contact 42 are implanted with donor impurities to form regions 36,38 to improve source and drain ohmic contact conductivity. These implanted impurities must, of course, be prevented from entering the middle section 36 the GaAlAs layer 28 beneath the gate 44. This is best accomplished by using the overhanging mushroom-shaped control gate as an integral mask for the implant. In this manner, a self-aligned gate structure is fabricated which, in turn, further reduces ohmic losses. The impurity implant may be by conventional means followed by a 900° C., 8 second quartz-IR anneal or it may be by ion beam mixing. The preferred impurity dopants for use in rendering the GaAlAs layers conducting is silicon at a fluence of $5\times10^{13}/cm^2$ at 250 KeV followed by Ge at a fluence of $1\times10^{13}/cm^2$ at 100 KeV. The donor impurities are shown by cross hatchings in FIG. 2. The choice of materials for the heteroepitaxial layer 28 is contingent upon forming a lattice match with the active channel material. I the embodiment of FIG. 2 Gallium Aluminum Arsinide was used. The nominal thickness of heteroepitaxial layer 28 is 6 to 30 nanometers.

The source 40 and the drain contacts 42 are conventional and may be fabricated by any known technique.

The gate control contact 44 may take a variety of forms and may be fabricated of a variety of materials. In FIG. 2 it is conveniently fabricated of titanium tungsten metal in a mushroom configuration.

Figure 3:
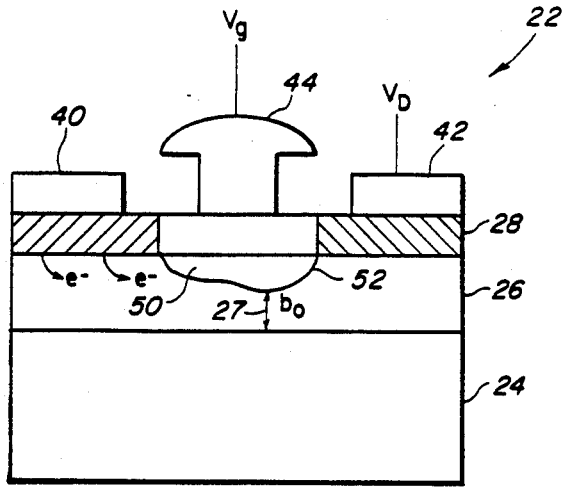
FIG. 3 is a second schematic cross-sectioned diagram of the embodiment of FIG. 2.

Referring now to FIG. 3, operating characteristics of the embodiment of FIG. 2 are discussed.

In operation a negative potential applied to the metal gate contact 44 creates a depletion region 50 that acts like an insulating region and restricts the opening 27 of the active channel 26 available for current flow. The width of the depletion region 50 depends on the applied voltages $V_g$ and $V_D$. At zero applied gate voltage the depletion region 50 appears as shown in FIG. 3. When the depth of the deletion region 50 is large the resistance to current flow is increased.

The current flowing into the drain 42 follows the equation $$I_D = Zqnv_Db. \quad (1)$$

where Z is the width of the active channel 26, q is the charge of an electron $1.60218\times10^{-19}$ coloumb), n is the doping density within the active channel 26, $V_D$ is the applied drain voltage, and b is the height of the channel opening at the depletion region.

Figure 4:
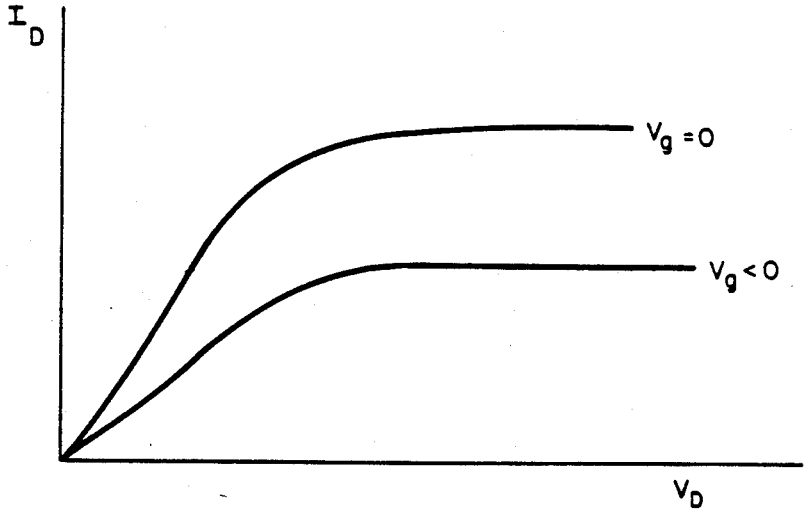
FIG. 4 is a graph of drain current vs. drain voltage.

The voltage along the channel increases from zero at the source 40 to $V_D$ at the drain 42. Thus the electric field under gate contact 44 becomes increasingly higher and the depletion region 50 becomes wider as we proceed from source 40 to drain 42. The resulting decrease in channel opening must be compensated by an increase in electron velocity to maintain a constant current through the channel. As $V_D$ is increased further, the electrons reach the saturation velocity at the drain end of the gate 52. The channel is constricted to the smallest cross section $b_o$ under the drain end of gate 44, the electric field reaches the critical value at this point, and $I_D$ 54 starts to saturate as illustrated in FIG. 4.

If the drain voltage is increased beyond $V_{D\,sat}$, the depletion region widens toward the drain 42. This action results in a positive slope of the $I_D$–$V_D$ and a finite drain resistance beyond current saturation.

When a negative voltage is applied to the gate in FIG. 3, the depletion width becomes larger. For small $V_D$, the channel acts as a linear resistor with large resistance due to narrower channel opening. As $V_D$ increases, the critical field is reached at a drain current $I_D$ 56 lower than in the $V_g=0$ case due to the larger channel resistance. For a further increase in $V_D$, the current $I_D$ 56 remains saturated.

In the traditional MESFET of FIG. 1 the electrons flow from the source to the drain and the initial doping sets the electron carrier density. If the gate 16 is driven positive the electrons will be increasingly attracted into the gate contact 16 thus decreasing the current flow to the drain 18. As the gate 16 becomes increasingly positive all the electrons eventually will be attracted into the gate 16.

Due to the conduction-band-offset, electrons from the heteroepitaxial layer 28, FIG. 3, are injected into the lower bandgap active channel 26. The injected electrons have more energy than the electrons initially within the active channel 26. The injected electrons are commonly referred to as hot. In the present device the additional electrons injected into the channel 26 by virtue of the heteroepitaxial layer 28 increase the charge carrier density beyond the initial doping value. This increased current carrying capability in conjunction with the restricted channel opening allows an increased electric field on the critical drain edge of the gate 52. The increased electric field permits an increased drain saturation value according to equation 1. Also, as the middle region 36 of heteroepitaxial layer 28 is a semi-insulator, it permits the control gate 44 to be driven somewhat more positive without incurring the penalty of drawing excessive gate current. Due to the hot carrier injection and increased positive gate bias, far more electrons than the initial doping-density-limited number are flowing in the channel. Since the gallium aluminum arsenide sections 32,34 beneath the source 40 and drain 42 contacts are heavily doped, there is a ready source of carriers injected into the active channel 26. Accordingly, the carrier density of the electrons increases rather than being limited to the initial doping. Increases have been measured up to $5\times10^{18}/cm^3$. This operation mode is referred to as the accumulation mode. The electrons are accumulated to a density greater than the background doping of the active channel. This increases the maximum current $I_D$ 5 to 6 times the value possible in conventional MESFETs.

The heteroepitaxial layer 28 may be deposited in any known manner including the techniques of molecular beam epitaxy (MBE) or by metal Oxide Chemical Vapor Deposition (MOCVD).

Figure 5:
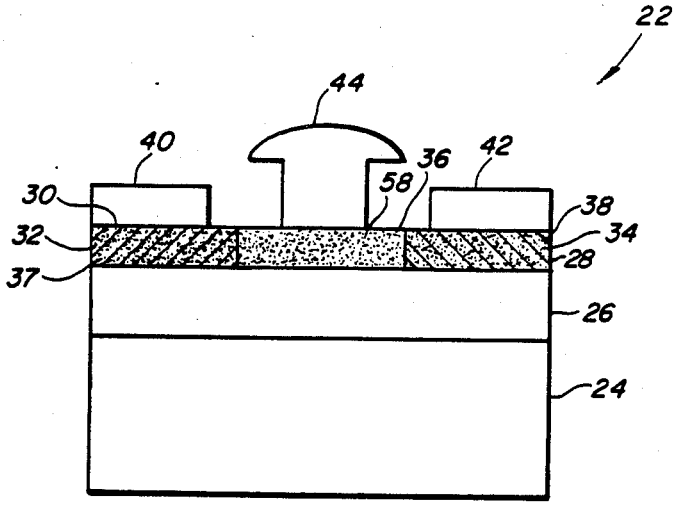
FIG. 5 is a schematic cross-sectioned diagram of a second embodiment of the transistor of the present invention showing implanted donor impurities.

FIG. 5 shows a second embodiment of Transistor 22 wherein the heteroepitaxial layer 28 may be initially impurity doped with vanadium or Chromium 58, not to exceed a level of $5\times10^{15}/cm^3$, which further improves the insulating qualities of the layer 28. When donor impurities are added to GaAlAs they thermalize to the conduction band making the semiconductor a better conductor. However certain types of impurities whose energy levels in gallium aluminum arsenide are deep, (i.e., energy level midway between conduction and valance band) for example vanadium and chromium, they become trapped (cannot thermalize) and the fermi-level is pinned at mid band gap. Their energy is such that at room temperatures they cannot ionize and thermalize into the conduction band. The residual background donors density in the gallium aluminum arsenide is less than that of the implanted vanadium or chromium 58 and are thus compensated and not available for current conduction. Since breakdown between gate and drain typically occurs on the surface of the MESFET semiconductor 10, FIG. 1, the presence on the surface of insulating region 36 of QAMFET 22, FIG. 2, serves to significantly increase breakdown voltage.

As certain regions 32,34 of the GaAlAs layer 28 now contain donor impurities whose energy levels exceed those of the underlying GaAs 26 conduction band edge and whose concentration density exceeds that of the vanadium, hot carriers are injected into the GaAs channel without incurring the penality of additional ionized impurity scattering within the channel. As such, the sheet current density within the active channel 26 increases without decreasing channel mobility thereby leading to increased transconductance and device gain. This aspect is, however, somewhat offset (at gate voltage below zero) by the electric field drop across the GaAlAs semi-insulating layer 28. Gain at higher drive levels, however, substantially exceeds that of a MESFET. Additionally, because of its higher impurity doping in conjunction with its underlying active channel, the GaAlAs layer 28 prevents surface states from self depleting the active GaAs channel 26. In prior art gallium arsenide active channel MESFETs devices 10 of FIG. 1, a metal gate 16, a source contact 14 and a drain contact 18 would be placed directly on the channel layer 12. This leaves open sections 15,17 of the channel layer 12 exposed to the surrounding air. The gallium and arsenide atoms exposed to the air cannot form proper covalent bonds. The bonding that takes place has an improper lattice spacing forming a monolayer near the surface of the channel layer 12 with a fixed negative surface charges. These surface charges are detrimental because they repel electrons in the active channel. In essence they form depletion regions. In prior art GaAs MESFETs this problem is countered by forming a recessed gate well. Then the negative charges at the surface do not deplete down to the depth of the channel opening. By covering the active channel layer 26 of the present device with the gallium aluminum arsenide, fewer fixed charges are formed at the surface and depletion of the underlying channel 26 is minimized.

Figure 6:
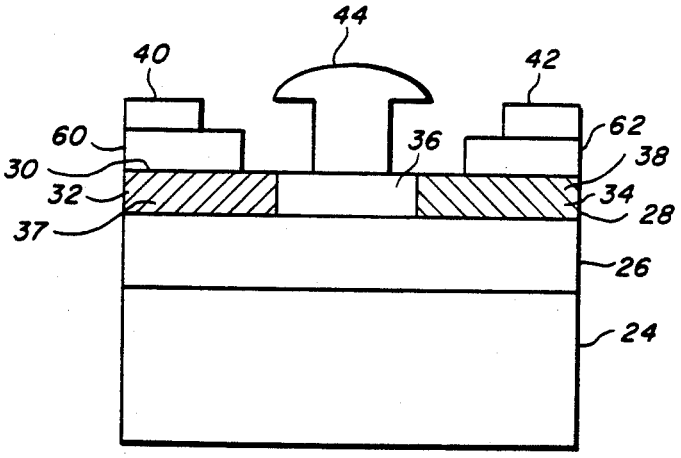
FIG. 6 is a schematic cross-sectioned diagram of a third embodiment of the transistor of the present invention showing a second heteroepitaxial layer disposed between the source contact and the first heteroepitaxial layer, and a third heteroepitaxial layer disposed between the drain contact and the first heteroepitaxial layer.

FIG. 6 show a third embodiment of invention wherein heavily (e.g., $2\times10^{18}/cm^3$) donor doped GaAs heteroepitaxial layers 60, 62 are deposited over the first and second regions 32, 34 of the first heteroepitaxial layer 28 before deposition of the source and drain contacts 40, 42. Layers 60, 62 further improve overall transistor performance by additionally reducing contact resistance. Each layer 60, 62 is approximately 30 nanometers in thickness.

The present Transistor device 22, FIG. 2, has significantly improved device efficiency and improved linearity (reduced intermodulation product distortion) at any given frequency.

Figure 8:
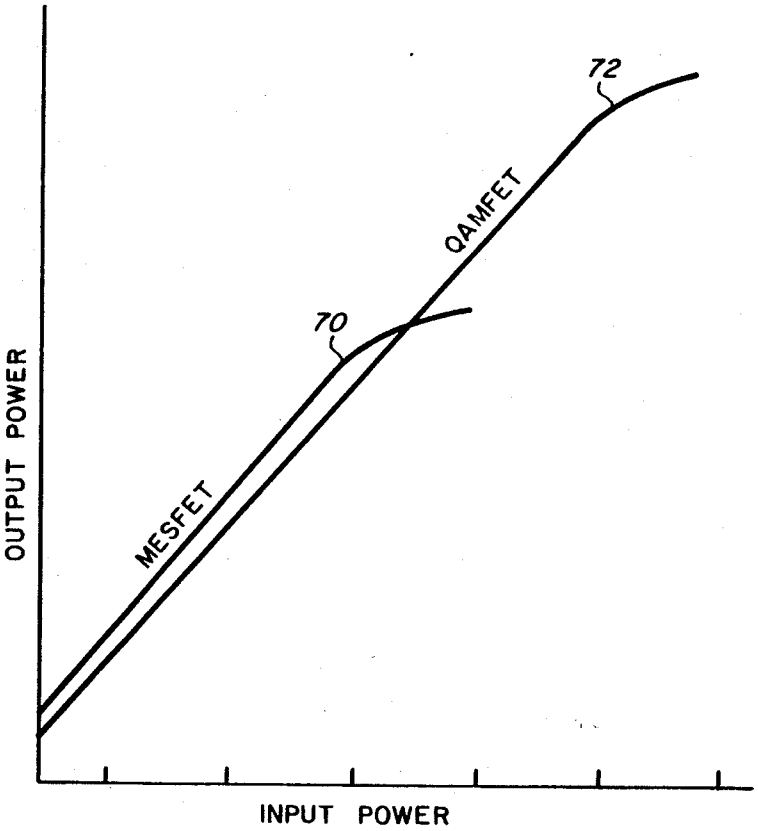
FIG. 8 is a graph comparing output power vs. input power of a MESFET and a QAMFET.
Figure 7:
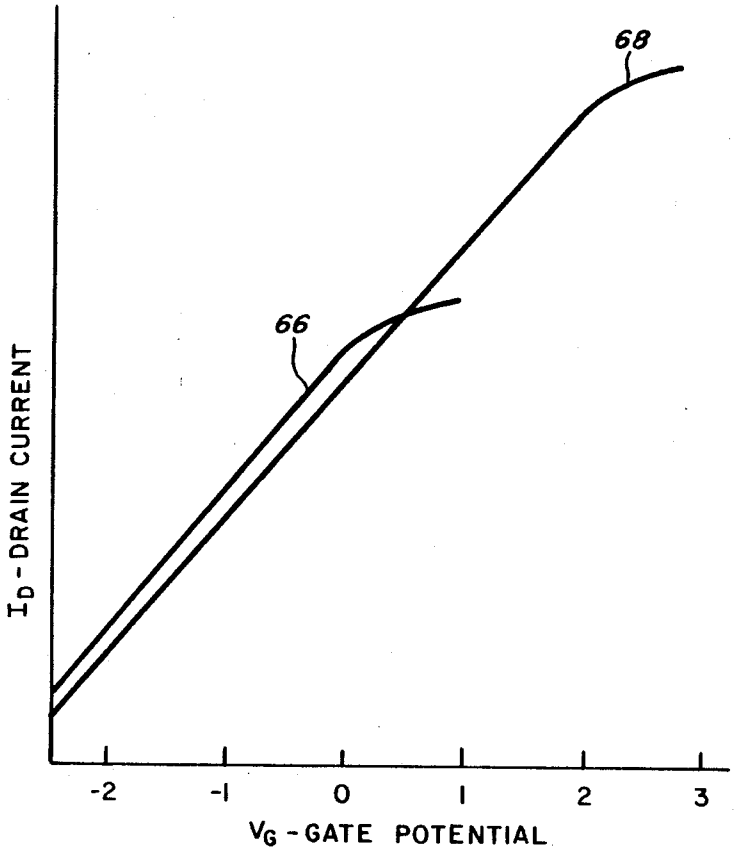
FIG. 7 is a graph comparing drain current vs. gate potential of a MESFET and a QAMFET.

Shown in FIG. 7, is a conventional MESFET drain current/gate voltage characteristic compared with the characteristic of the quasi-accumulation mode field effect transistor (QAMFET) of the present invention. As the gate is driven positive in a conventional MESFET curve 66, the output current saturates. In the QAMFET curve 68, under similar drive, the device automatically converts from depletion mode operation to accumulation mode operation and increases its output current by a factor of up to 5 before saturating. FIG. 8 illustrates this relationship as a function of input power and output power. Where the input/output relationship becomes nonlinear, the output power begins to saturate and unwanted harmonics and intermodulation product signals appear. It is seen that a much larger dynamic range of signal handling capability is possible with the QAMFET 72 than with the MESFET 70 before saturation appears.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A quasi accumulation mode field effect transistor, comprising:

a semi-insulating substrate layer;

an active channel layer of doped n-type semi-conductor material disposed on said semi-insulating substrate layer, said channel layer being about 120 nanometers thick and purposely doped to a concentration of not less than $1\times10^{17}$ impurity atoms per cubic centimeter;

a first heteroepitaxial semi-insulating layer of a semiconductor material disposed on said active channel layer, said first heteroepitaxial layer material having a bandgap greater than the bandgap of the active channel layer material, said first heteroepitaxial layer having a top surface, a designated first region, a designated second region, and a middle region therebetween, wherein the first region and the second region of said first heteroepitaxial layer are implanted with donor impurities and activated;

a source contact disposed on the top surface of the first heteroepitaxial layer on said first region;

a drain contact disposed on the top surface of the first heteroepitaxial layer on said second region; and a gate control contact disposed on the first heteroepitaxial layer on the middle section between the source contact and the drain contact, said gate control contact being physically separated from the source and drain contacts.

2. The quasi accumulation mode field effect transistor of claim 1 wherein said first heteroepitaxial layer is n+ in the regions beneath source and drain contacts.

3. A method of forming a quasi accumulation mode field effect transistor, comprising the steps of:

providing a semi-insulating substrate layer;

disposing an active channel layer of doped n-type semi-conductor material on said semi-insulating substrate layer;

disposing a first heteroepitaxial semi-insulating layer of a semi-conductor material on said active channel layer, said first heteroepitaxial layer material having a bandgap greater than the bandgap of the active channel layer material, said first heteroepitaxial layer having a top surface, a designated first region, a designated second region, and a middle region therebetween wherein the first region and the second region of said first heteroepitaxial layer are implanted with donor impurities and activated;

disposing a source contact on the top surface of the first heteroepitaxial layer above said first region;

disposing a drain contact on the top surface of the first heteroepitaxial layer above said second region; and disposing a gate control contact on the first heteroepitaxial layer, said gate control contact positioned on the middle section between the source contact and the drain contact, said gate control contact being physically separated from the source and drain contacts.

4. The method of forming a quasi accumulation mode field effect transistor as recited in claim 3, further comprising the steps of:

disposing a layer of n+doped semi-conductor material between the source contact and the first heteroepitaxial layer; and disposing a layer of n+doped semi-conductor material between the drain contact and the first heteroepitaxial layer;

wherein said n+doped semi-conductor material layers form second and third heteroepitaxial layers.

5. The method of forming a quasi accumulation mode field effect transistor as recited in claim 3 further comprising the step of:

implanting said first heteroepitaxial layer with activated n+donor impurities to form an n+ first heteroepitaxial layer.

6. A quasi accumulation mode field effect transistor, comprising:

a gallium arsenide substrate layer;

an active channel layer of doped n-type gallium arsenide disposed on said gallium arsenide substrate layer, said channel layer being about 120 nanometers thick and purposely doped to a concentration of not less than $1\times10^{17}$ impurity atoms per cubic centimeter;

a first heteroepitaxial semi-insulating layer of gallium aluminum arsenide disposed on said active channel layer, said first heteroepitiaxial layer material having a bandgap greater than the bandgap of the active channel layer material, said first heteroepitaxial layer having a top surface, a designated first region, a designated second region, and a middle region therebetween, wherein the first region and the second region of said first heteroepitaxial layer are implanted with donor impurities and activated;

a source contact disposed on the top surface of the first heteroepitaxial layer above said first region;

a drain contact disposed on the top surface of the first heteroepitaxial layer above said second region; and a gate control contact disposed on the first heteroepitaxial layer, said gate control contact positioned on the middle section between the source contact and the drain contact, said gate control contact being physically separated from the source and drain contacts.

7. The quasi accumulation mode field effect transistor of claim 6 wherein said heteroepitaxial layer contains Vanadium as impurity in concentration not to exceed $5\times10^{15}$ per cubic centimeter.

8. A quasi accumulation mode field effect transistor, comprising:

a semi-insulating substrate layer;

an active channel layer of doped n-type semiconductor material disposed on said semi-insulating substrate layer, said channel layer being about 120 nanometers thick and purposely doped to a concentration of not less than $1\times10^{17}$ impurity atoms per cubic centimeter;

a first heteroepitaxial semi-insulating layer of a semiconductor material disposed on said active channel layer, said first heteroepitaxial layer material having a bandgap greater than the bandgap of the active channel layer material, said first heteroepitaxial layer having a top surface, a designated first region, a designated second region, and a middle region therebetween, wherein the first region and the second region of said first heteroepitaxial layer are implanted with donor impurities and activated;

a layer of n+ doped semiconductor material positioned on said first region of said first heteroepitaxial layer;

a source contact disposed on the top surface of the layer of n+ doped semi-conductor material;

another layer of n+ doped semiconductor material positioned on said second region of said first epitaxial layer;

a drain contact disposed on the top surface of said another layer of n+ doped semiconductor material; and a gate control contact disposed on said middle region of the first heteroepitaxial layer between the source contact and the drain contact, said gate contact being physically separated from the source and drain contacts.

9. A quasi accumulation mode field effect transistor, comprising:

a semi-insulating substrate layer;

an active channel layer of doped n-type semiconductor material disposed on said semi-insulating substrate layer, said channel region being about 120 nonometers thick and purposely doped to a concentration of not less than $1\times10^{17}$ impurity atoms per cubic centimeter;

a first heteroepitaxial semi-insulating layer of a semiconductor material disposed on said active channel layer, said first heteroepitaxial layer material having a bandgap greater than the bandgap of the active channel layer material, said first heteroepitaxial layer having a top surface, a designated first region, a designated second region, and a middle region therebetween, wherein the first region and the second region of said first heteroepitaxial layer are implanted with donor impurities and activated;

a layer of n+ doped semiconductor material positioned on said first region of said first heteroepitaxial layer;

a source contact disposed on the top surface of said layer of n+ doped semiconductor material;

another layer of n+ doped semiconductor material positioned on said second region of said first heteroepitaxial layer;

a drain contact disposed on the top surface of said another layer of n+ doped semiconductor material; and a gate control contact disposed on the first heteroepitaxial layer, said gate control contact positioned on the middle section between the source contact and the drain contact, said gate control contact being physically separated from the source and drain contacts.

* * * * *